United States Patent
Angelini et al.

(10) Patent No.: US 12,425,777 B2
(45) Date of Patent: Sep. 23, 2025

(54) READ CIRCUIT FOR CAPACITIVE SENSORS, CORRESPONDING SENSOR DEVICE AND METHOD

(71) Applicant: STMicroelectronics S.r.l., Agrate Brianza (IT)

(72) Inventors: Paolo Angelini, Bologna (IT); Roberto Pio Baorda, Casarile (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 242 days.

(21) Appl. No.: 18/151,207

(22) Filed: Jan. 6, 2023

(65) Prior Publication Data

US 2023/0232165 A1    Jul. 20, 2023

(30) Foreign Application Priority Data

Jan. 20, 2022    (IT) .................. 102022000000929

(51) Int. Cl.
*H04R 19/04* (2006.01)
*G01R 19/165* (2006.01)

(52) U.S. Cl.
CPC ....... *H04R 19/04* (2013.01); *G01R 19/16576* (2013.01); *H04R 2201/003* (2013.01)

(58) Field of Classification Search
CPC .............. H04R 19/04; H04R 2201/003; G01R 19/16576

See application file for complete search history.

(56) References Cited

U.S. PATENT DOCUMENTS

| | | | |
|---|---|---|---|
| 9,319,779 B2 * | 4/2016 | Jenkner | .......... H04R 17/02 |
| 2009/0121778 A1 | 5/2009 | Ceballos et al. | |

* cited by examiner

*Primary Examiner* — Sunita Joshi
(74) *Attorney, Agent, or Firm* — Slater Matsil, LLP (57) ABSTRACT

A read circuit for capacitive sensors such as a MEMS microphones includes a sensor node configured to be coupled to a capacitive sensor to apply a bias voltage to the sensor and sense the capacitance value of the sensor wherein the voltage at the sensor node is indicative of the capacitance value of the capacitive sensor. A switch is provided between the sensor node and the intermediate node. A shock detector coupled to the sensor node and the switch asserts a shock signal to make the switch conductive in response to a shock applied to the capacitive sensor, and de-asserts the shock signal to make the switch non-conductive with a delay after the end of the shock applied to the capacitive sensor.

20 Claims, 4 Drawing Sheets

READ CIRCUIT FOR CAPACITIVE SENSORS, CORRESPONDING SENSOR DEVICE AND METHOD

CROSS-REFERENCE TO RELATED APPLICATIONS

This application claims priority to Italian Patent Application No. 102022000000929 filed on Jan. 20, 2022, which application is hereby incorporated by reference herein in its entirety.

TECHNICAL FIELD

The present disclosure generally relates to capacitive sensors, and in particular embodiments, to a micro-electromechanical system (MEMS) type microphone based on capacitive sensors.

BACKGROUND

A microphone is a transducer (namely, a sensor) capable of converting sound into an electrical signal. The possible range of applications of microphones is extensive. Various possible applications include capacitive sensors such as MEMS microphones that are desired to be read when used in a constant charge configuration, where a capacitor is biased with a high-impedance network to preserve the charge stored therein.

Components such as diodes or transistors are currently used to provide a high resistance value with a reduced area. The resistance value obtained is otherwise dependent on the voltage applied to such components. In the presence of a strong input signal (e.g., in response to a shock), the impedance value of the high-impedance (Hi-Z) network may decrease, and the capacitor discharged. The time taken for recharging the capacitor can be (very) long due to the associated time constant being slow, which is not acceptable for various applications.

SUMMARY

An object of one or more embodiments is to contribute to adequately addressing the issues discussed in the foregoing.

According to one or more embodiments, such an object is achieved via a circuit having the features set forth in the claims that follow.

One or more embodiments relate to a corresponding sensor device. A sensor device including a MEMS microphone can be exemplary of such a device.

One or more embodiments relate to a corresponding method.

The claims are an integral part of the technical teaching provided herein in respect of the embodiments.

In certain embodiments presented herein, a passive (high-value, e.g., Giga Ohm) resistor is added in series with the high-impedance (Hi-Z) network. This facilitates detecting a voltage variation propagating therebetween in response to a large input signal (as resulting from a shock, for instance).

In the embodiments presented herein, an associated peak detector generates a digital "shock" signal (e.g., equal to "1") just after the shock is applied to the circuit and during a time interval that lasts until after the shock is finished (as a function of the decay time constant of the peak detector).

In the embodiments presented herein, with the digital shock signal at "1," the high-impedance circuit is in a reset state (de facto short-circuited), and the capacitance is connected directly to the passive resistor added.

In the embodiments presented herein, thanks to the decay time constant of the detector, the high-impedance network will (still) be in such a reset state for a time even after the shock ends, and the charge in the capacitor will be restored with a faster time constant through the added resistor.

In the embodiments presented herein, using such a shock signal (also) in an analog front end facilitates achieving a short recovery time also for the analog front (AFE).

Embodiments, as presented herein, are advantageous in comparison with previous solutions where the occurrence of a shock condition is attempted to be detected by monitoring the output of an amplifier.

Such an approach suffers from an undesired increase of noise in the analog blocks following the analog front end (e.g., analog-to-digital converter, anti-aliasing filter).

In contrast with prior art arrangements (as discussed, e.g., in U.S. Pat. No. 9,319,779 B2, where the MEMS capacitor is reset and the microphone is muted during a shock), embodiments as presented herein benefit from the provision of a memory feature, namely an anti-shock circuit which does not release the input capacitor just after an overcurrent ends. This facilitates resetting the capacitor node adequately in response to the end of the shock.

Embodiments, as presented herein, provide a way of facilitating a fast recovery after a large input signal (e.g., a shock) applied in an analogue front end (AFE) configured to read a capacitive sensor biased with a constant charge.

BRIEF DESCRIPTION OF THE DRAWINGS

For a more complete understanding of the present disclosure and the advantages thereof, reference is now made to the following descriptions taken in conjunction with the accompanying drawings, in which.

Corresponding numerals and symbols in the different figures generally refer to corresponding parts unless otherwise indicated.

The figures are drawn to illustrate the relevant aspects of the embodiments clearly and are not necessarily drawn to scale.

The edges of features drawn in the figures do not necessarily indicate the termination of the extent of the feature.

DETAILED DESCRIPTION OF ILLUSTRATIVE EMBODIMENTS

In the ensuing description, various specific details are illustrated to provide an in-depth understanding of various examples of embodiments according to the description. The embodiments may be obtained without one or more of the specific details or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment," "in one embodiment," or the like, that may be present in various points of the present description do not necessarily refer exactly to one and the same embodiment. Furthermore, particular configurations, structures, or characteristics may be combined in any adequate way in one or more embodiments.

The headings/references used herein are provided merely for convenience and hence do not define the extent of protection or the scope of the embodiments.

Also, throughout this description, the same designation may be used for brevity to designate: both a certain node or line and a signal occurring at that node or line, and both a certain component (e.g., a capacitor or a resistor) and an electrical parameter thereof (e.g., capacitance or resistance/impedance).

Figures 1, 2:
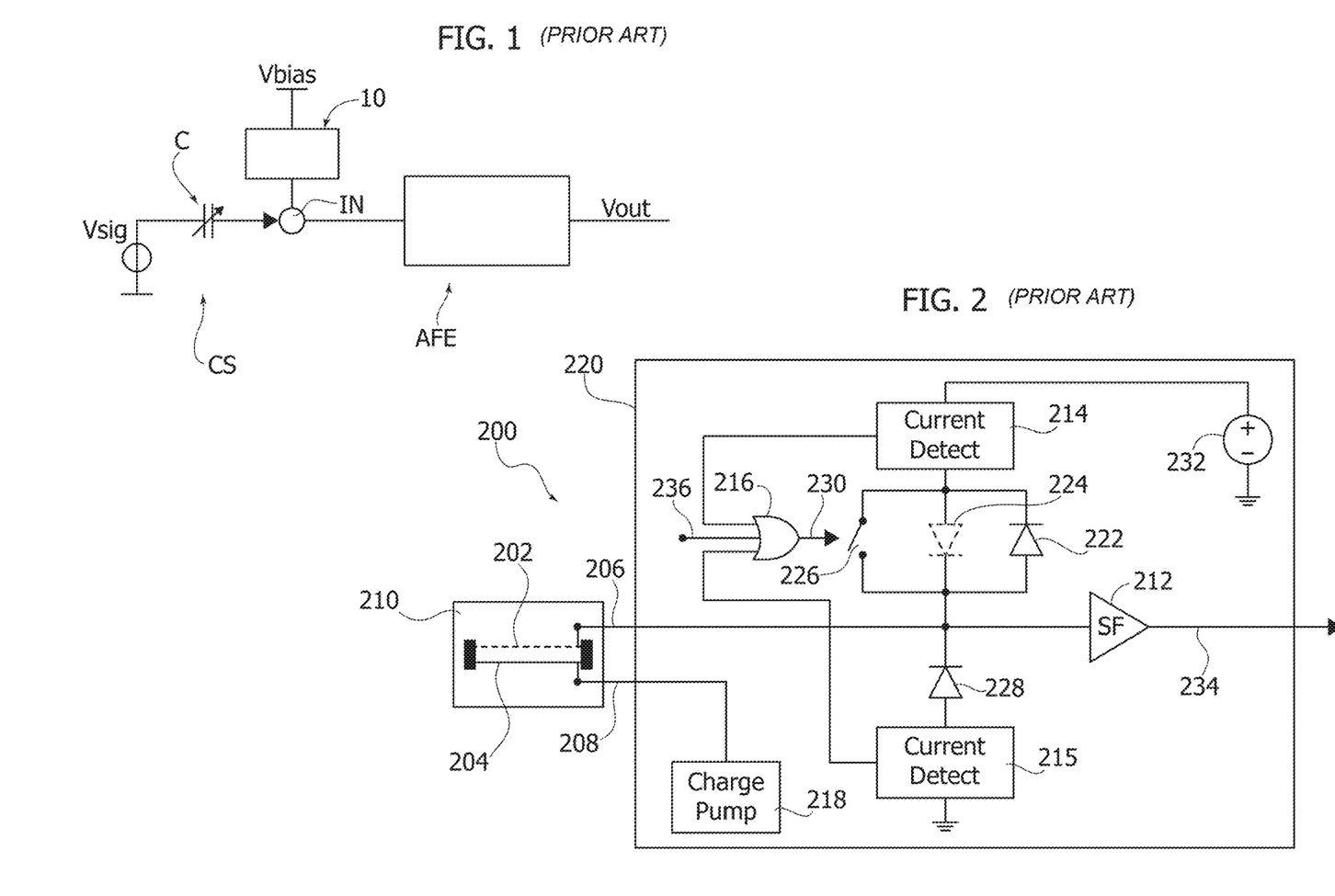
FIG. 1 is a block diagram of a conventional MEMS microphone.
FIG. 2 is a block diagram of a MEMS microphone arrangement proposed in the prior art.

FIG. 1 is a block diagram of a conventional analog front end AFE configured to read a capacitive sensor CS. This configuration is commonly used in sensor circuits such as microphone ICs based on capacitive sensors.

In these circuits, a constant-charge configuration is frequently used where a capacitive component (hereinafter, briefly, "the capacitor") C is biased via a high-impedance (Hi-Z) network 10 coupled to a bias node at a voltage Vbias to preserve the charge Q stored on the capacitor C.

A variation of the capacitance value of the capacitor C induced by an input (sound) signal $S_{in}$ will generate a voltage signal that will be read as $V(S_{in})$ and amplified by the analog front end AFE.

The following relationship is found to apply starting from the basic equations for the capacitance C of the capacitor (that acts as a sound sensor): $V(S_{in})=Q/C(S_{in})$, where Q is an (electrical) bias charge applied to the capacitor whose capacitance value C varies as a function of the input (sound) signal $S_{in}$.

As already discussed, reading a capacitive sensor CS accurately in a constant charge configuration is facilitated by biasing the capacitive sensor via a (very) high-impedance network 10. The value of this impedance (Hi-Z) results from a trade-off of various factors.

The input signal, modeled in FIG. 1 as a generator Vsig arranged in series with the capacitor C, is high-pass filtered at a node IN with a time constant given by the product C*Hi-Z of the value C of the capacitor and the impedance of the network 10, designated Hi-Z.

The minimum impedance value of the network 10 is determined by the minimum frequency F_min of the signal that is desired to be passed, based on the relationship: Hi-Z>1(2*π*F_min)

The noise introduced by the high-impedance network 10 is low-pass filtered with the same time constant.

The impedance Hi-Z can be maximized to reduce the noise in the signal bandwidth, keeping in mind that the node IN can be affected by leakage and coupling with noisy nets.

In integrated circuits (ICs) for use as microphones, to obtain a high-pass frequency of about 1 Hz with a capacitor value C in the picofarad (pF) range and a negligible noise contribution in the audio bandwidth (20 Hz-20 KHz), the desired value for the impedance Hi-Z of the network 10 may be in the range of Tera Ohms (~TΩ).

Such a value is hardly achievable in ICs using passive resistors because of their area occupation. Active components such as MOS transistors or diodes, biased in particular conditions, may facilitate achieving such an impedance value.

A drawback inherent in using active components lies in their equivalent resistance values being markedly dependent on the voltage across their nodes (in the case illustrated in FIG. 1, on the voltage at the node IN).

Consequently, in the presence of a large input signal (as resulting from a shock, for instance), the value of the impedance Hi-Z of the network 10 will decrease, with a current flowing through the network 10 leading to the capacitor C being discharged.

Once the shock ends, the capacitor C (having been discharged) will generate across its terminals a voltage that will be read as a large signal by the analog front end.

In certain cases, that signal will be large enough to cause the analog front end AFE to saturate. This saturation (perceived as a negative factor in microphone applications) will last until the charge at the capacitor C is adequately restored.

Due to the "slow" time constant at the node IN, this process can be undesirably long (in the range of seconds).

A judicious choice of the voltage gain of the analog front end AFE makes it possible to detect the occurrence of shocks by monitoring the output Vout of the analog front end AFE.

For example, in response to the voltage at the node IN reaching an upper $SIG_{MAX}$ the output Vout may reach a value=0.9*VDD (where VDD denotes, for the sake of simplicity, the highest voltage expected at the output of the analog front end AFE). In that way, when Vout>0.9*VDD, one may assume that the circuit is exposed to a "shock" and keep the circuit in a reset condition so that, after the shock ends, the node IN resets quickly.

A drawback of this approach lies in that the reduction of the gain of the front end AFE to achieve, for example, Vout=0.9*VDD at full scale will increase the noise level in the analog blocks following the front end AFE (these may include an analog-to-digital converter and an anti-aliasing filter, for instance). Additionally, entering a "reset" condition while continuing to read the shock at the output Vout may not be easy to implement.

Another solution may involve a (passive) resistor to avoid the discharge of the capacitor C in the presence of a shock signal. As discussed, to be effective, such a resistor should be in the Tera Ohm range, with a correspondingly large area occupation.

Additional circuitry can be involved by clamping the node IN (see FIG. 1) when the signal is outside the absolute maximum rating (AMR) of the related technology. If the clamp circuit is turned on by the shock, the charge will be lost by the capacitor C and then recovered only quite slowly after the shock.

FIG. 2 herein reproduces the homologous figure in document U.S. Pat. No. 9,319,779 B2, where the following definitions apply:

200>MEMS microphone system
202>backplate
204>deflectable membrane
206-208>terminals
210>capacitive MEMS microphone
212>amplifier
214-215>current detectors
216>OR gate
218>charge pump 222-224>diodes
226>switch
228>diode
230>switch control signal
232>voltage source
234>output
236>input In the solution disclosed in U.S. Pat. No. 9,319,779 B2, a current detector 214 facilitates detecting a large (positive) signal at a node such as 206 in response to a diode 222 becoming forward-biased. A further current detector circuit 215 detects a negative shock. Once a current is detected, the node 206 is coupled (shorted) to a reference voltage level 232; this facilitates a fast recovery time after a shock.

As a first drawback, the solution disclosed in U.S. Pat. No. 9,319,779 B2 needs both detectors 214 and 215 to detect positive and negative shock signals.

As a further drawback, the current detectors 214 and 215 are comparators with no memory. When the shock ends, the switch 226 is released immediately so that the system will be unlikely to recover from a shock adequately, independently of the nature of the input shock.

For the same reason, the node 206 will be unlikely to reset adequately after the shock ends. During the shock, the node 206 is reset, and the microphone is muted during the shock.

To sum up, the examples discussed herein are related to circuits to read capacitive sensors such as Micro Electro-Mechanical Systems (MEMS) microphones used in a constant charge configuration.

The capacitor is biased with a high impedance (Hi-Z) network to preserve the charge stored therein. In microphone integrated circuits (ICs), the desired value for the Hi-Z network is in the Tera Ohm range.

As this is difficult to implement with passive resistors, active components such as Metal Oxide Semiconductor (MOS) transistors or diodes are used.

A drawback of this approach lies in that the equivalent resistance of these components depends on the voltage applied across their nodes.

In the presence of a large input signal (as deriving from a shock, for instance), the impedance value of the Hi-Z network decreases, and the capacitor will be discharged.

When the shock ends, since the capacitor has been discharged, a voltage is generated across its terminals, and read by an associated analog front end (AFE) as a large signal. In certain cases, this signal can saturate the AFE with saturation lasting until the charge at the capacitor is restored. Due to the slow time constant, this time can be very long, which is not acceptable for various applications.

Figure 3:
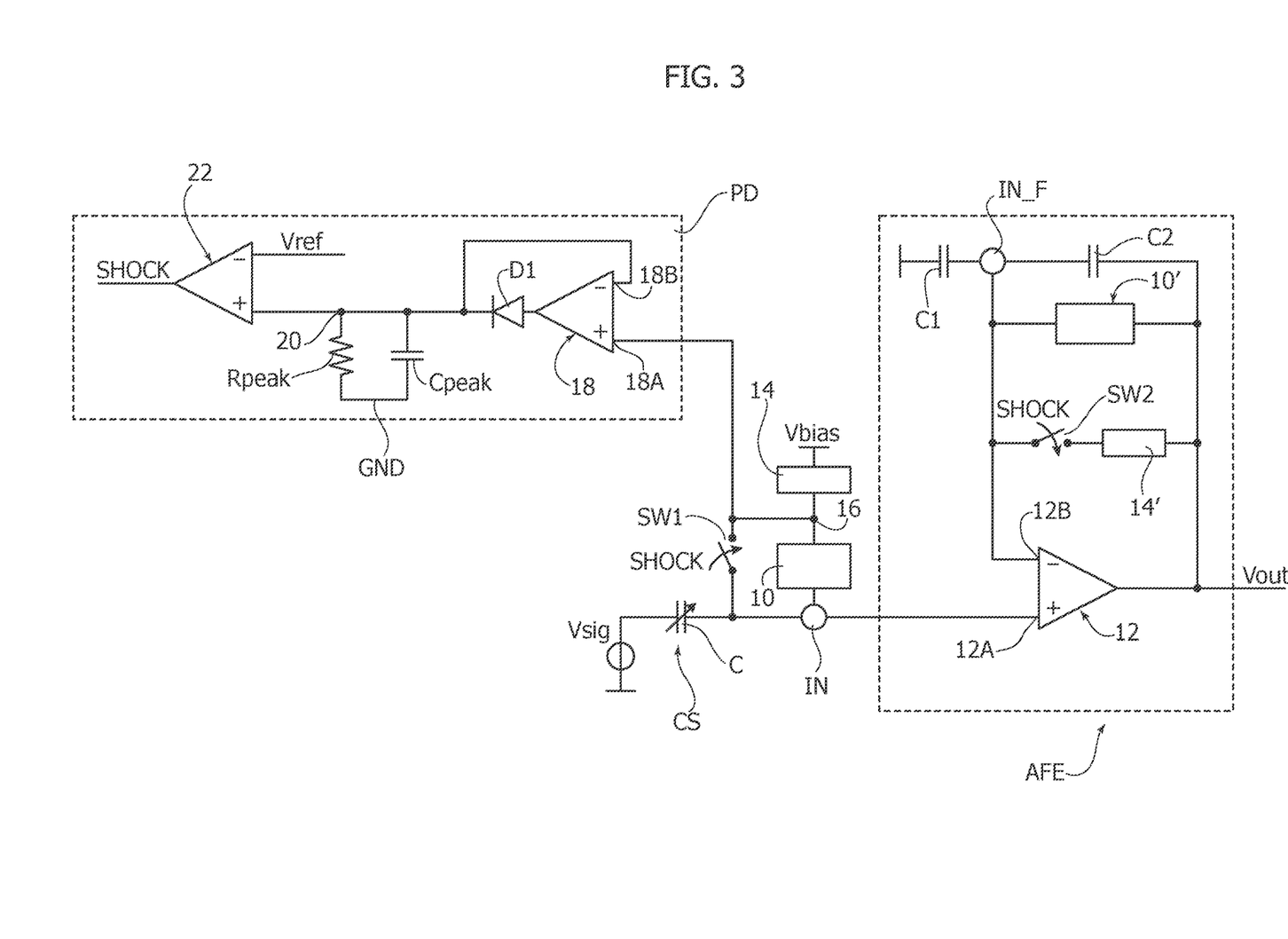
FIG. 3 is a block diagram of a MEMS microphone arrangement according to embodiments of the present description.

FIG. 3 is a block diagram of a MEMS microphone arrangement according to examples of the present description.

It is again recalled that corresponding numerals and symbols in the different figures generally refer to corresponding parts unless otherwise indicated: the description of parts already provided in connection with FIG. 1 thus applies also to FIG. 3.

FIG. 3 is a block diagram of a readout circuit in a MEMS microphone arrangement biased in constant charge configuration. Briefly, the circuit of FIG. 3 includes a sensor node IN configured to be coupled to a capacitive sensor CS to apply a bias charge to the sensor and sense a capacitance value C of the sensor, a bias node configured to be coupled to a bias charge source at a voltage Vbias, a high-impedance network 10 coupled between the sensor node IN and an intermediate node 16, and a bias resistor 14 coupled between the bias node Vbias and the intermediate node (16).

The high-impedance network 10 has a first impedance value (in the Tera Ohm range, for instance), and the bias resistor 14 has a second impedance value (in the Giga Ohm range, for instance) substantially lower than the first impedance value.

As illustrated in FIG. 3, a (first) switch SW1 is coupled between the sensor node IN and the intermediate node 16. In that way, the sensor node IN can be coupled to the bias node Vbias: with the switch SW1 non-conductive, via the series connection of the high-impedance network 10 and the bias resistor 14, or with the switch SW1 conductive, (only) via the bias resistor 14 with the high-impedance network 10 reset (short-circuited).

As illustrated in FIG. 3, a shock detector PD (implemented, for example, in the manner described in detail in the following) is coupled (via the network 10 and the node 16—also when the switch SW1 is open, that is, non-conductive) to the sensor node IN.

The shock detector PD is thus sensitive to the voltage at the sensor node IN and can be configured to assert a shock signal SHOCK and make the switch SW1 conductive in response to a variation (expectedly large and abrupt) of the voltage at the sensor node IN resulting from the applied to the capacitive sensor CS: this may be the case, for instance, when the sensor CS hits/is hit by an object.

The shock detector PD is otherwise configured to de-assert the signal SHOCK and make the switch SW1 (again) non-conductive with a delay after the end of the shock applied to the capacitive sensor CS.

Such a delay can be implemented in various conventional ways known to those of skill in the art (e.g., via a delay line or module). A possible advantageous implementation via a rectifier and an envelope detector is described in detail in the following.

In FIG. 3, an analog front end, again designated AFE, is illustrated structured around a differential stage (operational amplifier or Op-Amp) 12 receiving: at a first (e.g., non-inverting) input 12A, the signal at the node IN in the capacitive sensor CS, and at a second (e.g., inverting) input 12B, the signal from a (feedback) node IN_F that is the partition point of a capacitive divider include two capacitors of values C1 and C2 coupled between the node IN_F and a reference node (ground, for instance) and between the output node Vout from the Op-Amp 12 (the output from the circuit) and the node IN_F, respectively.

To facilitate having a gain G=C1/C2 in the audio bandwidth (pass band 20 Hz-20 KHz), a high impedance (Hi-Z) network 10' similar (virtually identical) to the Hi-Z network 10 is introduced (in parallel to the capacitor C2) in the feedback path of the OPA 12 between the output node Vout and the node IN_F.

The example presented in FIG. 3 also includes, in the feedback path of the OPA 12 between the output node Vout and the node IN_F (in parallel to the capacitor C2 and the Hi-Z network 10'), the series connection of a passive (feedback) resistor 14' and a (second) switch SW2 again controlled via the signal SHOCK from the shock detector PD.

The bias resistor 14' can be selected with a (third) resistance value—of the order of 1 Giga Ohm, for instance—that is very high, but still smaller than the (fourth) impedance value (e.g., in the Tera Ohm range) normally exhibited by of the Hi-Z network 10'.

The analog front end AFE provides a gain stage having an input node (e.g., 12A) coupled to the sensor node IN and an output node Vout configured to provide an output signal that is indicative of the capacitance value C of the capacitive sensor CS, and thus of the sensed (sound) signal Vsig.

It is again recalled that, throughout this description, the same designation can be used for brevity to designate both a certain node or line and a signal occurring at that node or line, as well as a component and the value of an electrical parameter (e.g., capacitance) associated therewith.

As illustrated in FIG. 3, the analog front end AFE thus includes a differential stage (e.g., the Op-Amp 12) having a first input 12A coupled to the sensor node IN, and feedback circuitry between an output node Vout and a second input 12B of the differential stage 12.

As illustrated in FIG. 3, the feedback circuitry includes: a first feedback capacitor C1 referenced to ground coupled to the feedback intermediate node IN_F, a second feedback capacitor C2 between the feedback intermediate node IN_F and the output node Vout of the differential stage 12 (and thus of the readout circuit as a whole), a feedback high-impedance network 10' between the feedback intermediate node IN_F and the output node Vout of the differential stage 12, the series connection of a feedback resistor 14' and a further switch SW2 between the feedback intermediate node IN_F and the output node Vout of the differential stage 12.

The feedback resistor 14' has a fourth impedance value (e.g., in the Giga Ohm range), that is substantially lower than the third impedance value of the network 10' (this can be in the Tera Ohm range)

As illustrated in FIG. 3, the node IN_F can be coupled to the output node Vout of the differential stage 12 via the parallel connection of the second capacitor C2 and: (only) the feedback high-impedance network 10' with the feedback resistor 14' disconnected since the further switch SW2 is non-conductive (signal SHOCK de-asserted), or the parallel connection of the feedback high-impedance network 10' and the feedback resistor 14' since the further switch SW2 is conductive (signal SHOCK asserted).

As illustrated in FIG. 3, the further switch SW2 is coupled to the shock detector PD so that the further switch SW2 is conductive and non-conductive in response to the shock signal SHOCK being asserted and de-asserted, respectively.

In normal operation of a sensor device as illustrated in FIG. 3, the possibility exists of detecting the "movement" (that is the voltage variations) of the node 16 between the Hi-Z network 10 and the resistor 14: the Hi-Z network 10 and the resistor 14 act as a resistive divider between the bias voltage Vbias and the voltage at the IN node.

In normal operation, the Hi-Z impedance network 10 has a resistance value (e.g., Tera Ohms) this is much higher (e.g., of three order of magnitude) than the value (e.g., Giga Ohms) of the resistor 14 (1 GOhm, for instance) and the node 16 will be at a voltage practically equal to Vbias.

If the impedance of the Hi-Z network 10 becomes smaller (it is noted that the Hi-Z circuit can include active devices), the voltage at the node 16 will move away from the value Vbias.

In the example illustrated in FIG. 3, the shock (peak) detector PD receives the voltage at the node 16; in the shock detector PD, the voltage at the node 16 is rectified via a "super-diode" including a gain stage such as a differential stage (operational amplifier or Op Amp) 18 and a diode D1.

In the example illustrated in FIG. 3, the Op-Amp receives: at a first (e.g., non-inverting) input 18A, the signal at the node 16, and at a second (e.g., inverting) input 18B, the signal from the cathode of a diode D1 whose anode is coupled to the output of the Op-Amp 18.

The signal from the "super diode" 18+D1 (i.e., the signal at the cathode of the diode D1, having its anode coupled to the output of the Op-Amp 18) is applied to, for example, a first terminal 20 of a parallel connection of capacitor Cpeak and a resistor Rpeak having its opposite terminal referred to a reference node (e.g., ground).

The voltage charged across the envelope detector 18, D1, Rpeak, Cpeak is supplied to a comparator 22 to be compared against a reference threshold Vref.

When the voltage charged across the envelope detector 18, D1, Rpeak, Cpeak rises up to reaching the threshold Vref, the comparator 22 will assert at its input the SHOCK signal that is indicative of a shock condition (SHOCK=1).

The foregoing is under the assumption that Vref is greater than or equal to Vbias to facilitate adequate shock detection, which is compatible with using a rectifier as described.

Thanks to the rectification action performed by the super-diode (Op-Amp 18 and diode D1), the node 20 will be able to be discharged with a time constant directed by the product Rpeak*Cpeak of the resistance and capacitance component of the envelope detector, which a time constant is slower than the expected variation of the shock signal.

In the example illustrated in FIG. 3, the signal SHOCK at the output of the peak detector PD (comparator 22) is asserted to turn on (make conductive) the switch SW1 to couple the nodes IN and 16 (practically to reset, that is short-circuit the Hi-Z network 10).

In the example illustrated in FIG. 3, when a shock (in signal Vsig) ends, the signal SHOCK will be maintained asserted (SHOCK=1) until the envelope node 20 is discharged to Vref (as noted, a correct shock detection is facilitated by having Vref≥Vias)

When SHOCK=1, the switch SW1 is closed, and the capacitor C is connected to the passive resistor 14, so that the node IN will continue to move (a little bit attenuated, and in any case replicated with gain by Vout) till the shock ends.

Because Vout is moving rail-to-rail (shock condition), also the Hi-Z circuit 10' in feedback path of the Op-Amp 12 will reduce its impedance, so there will be a loss of charge also at the node IN_F that the after shock would tend to be recovered with a very long time constant.

In the example illustrated in FIG. 3, the signal SHOCK at the output of the peak detector PD (comparator 22) is also used to turn on (make conductive) also the further switch SW2. The switch SW2 will connect the resistor 14' in parallel with C2 when SHOCK=1 (with the role of the Hi-Z network 10' becoming negligible due to its much higher impedance value).

After the shock ends, thanks to the decaying time constant Rpeak*Cpeak of the envelope detector in the shock detector PD, the switches SW1 and SW2 will remain (temporarily) closed, and the nodes IN and IN_F will be reset with a fast time constant (essentially given by the product of the resistance of the resistors 14, 14' times the capacitance of the capacitor C).

Stated otherwise (and by referring to FIG. 4 for simplicity), during the time where SHOCK=1 (block 100), the switch SW1 is closed, that is, made conductive, with the Hi-Z network 10 reset, that is bypassed (block 102) and the capacitor C is coupled to the bias node/voltage Vbias via the resistor 14 (e.g., 1 Giga Ohm).

Figure 4:
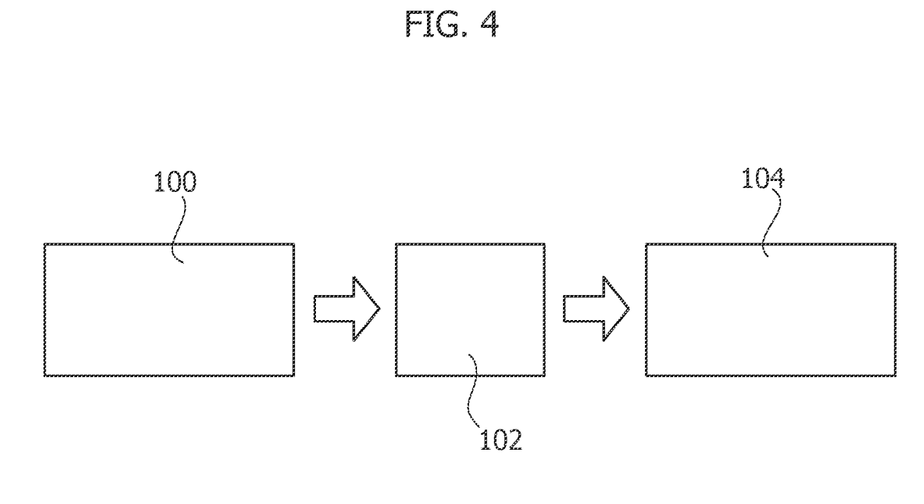
FIG. 4 is a functional block diagram exemplary of embodiments of the present description.

In that way the node IN keeps on moving with the signal Vsig (this also applying to the output node Vout).

As noted, Vout moves rail-to-rail (shock condition), and the Hi-Z circuit 10' in the feedback path of the Op-Amp 12 will reduce its impedance and causes a charge loss at the node IN_F. Also, in this case, the charge lost would be recovered after the shock ends with a long time constant. In the embodiment illustrated in FIG. 3, that issue is addressed via the resistor 14' (e.g., 1 Giga Ohm) that is connected in parallel to the capacitance C2 via the switch SW2 in response to SHOCK=1.

When the shock ends (see block 104 in FIG. 4), the time constant of the peak detector Rpeak*Cpeak will keep the switches SW1 e SW2 conductive so that the nodes IN e IN_F are reset with a "fast" time constant (dictated by the impedance of the resistors 14 and 14', for example, 1 GOhm multiplied by the capacitance involved) in comparison with the "slow" time constant otherwise dictated by the (much) higher impedance (e.g., 1 TOhm) of the Hi-Z networks 10 and 10'.

It is again noted the rectifier-based layout of the shock detector PD considered herein (left-hand side of FIG. 3) is merely exemplary.

Those of skill in the art can devise adequate alternative solutions to facilitate maintaining the switches SW1 and SW2 conductive after the shock ends to facilitate operation involving: detecting a shock condition via a shock detector (block 100 in FIG. 4), in response thereto, bypassing the Hi-Z circuit(s) (block 102 in FIG. 4), and releasing the bypass condition only sometime after the shock ends (block 104 in FIG. 4).

This time can be selected via the time constant of the shock detector, with a number of advantages, such as: no need to reduce the gain of the analog front end, no appreciable noise increase, use of two detectors (one for positive and one for negative shock) no longer necessary because a peak detector as discussed herein has a memory, the system works in a constant charge configuration (also) during the shock condition, so that the IN node and the voltage Vout are free to move: microphone sensitivity is thus maintained both during the shock and after the shock, low impact in term of area occupation.

Figure 5:
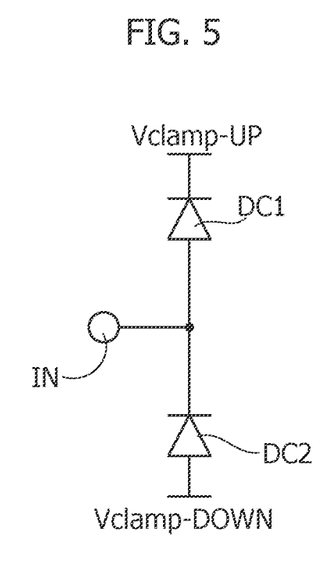
FIG. 5 illustrates possible details of embodiments of the present description.

If the voltage at the node IN becomes too high or too low (outside the AMR of the technology) a clamping feature can be provided as exemplified in FIG. 5, including a couple of diodes DC1 (upper clamping value Vclamp_UP) and DC2 (lower clamping value Vclamp_DOWN).

This facilitates devising a dedicated protection to increase robustness which is not possible with other layouts. The diodes increase circuit robustness without having any appreciable effect on "after shock" recovery time.

A circuit, as exemplified, is easy to integrate and does not require a large area.

FIGS. 6A to 6E are diagrams plotted versus a common (abscissa) time scale exemplary of the possible time behavior of signals occurring in embodiments of the present description. Ordinates of FIGS. 6A to 6E are in volt units.

Figure 6A:
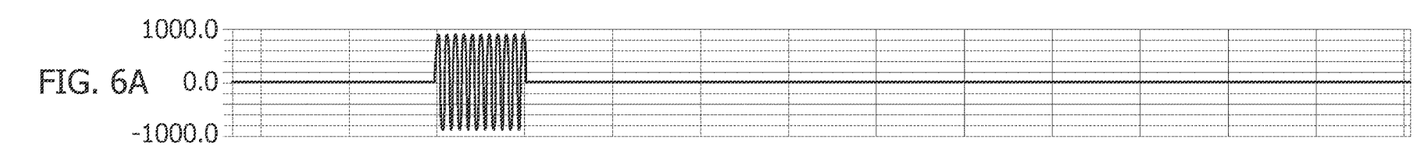
FIGS. 6A to 6E are diagrams plotted versus a common (abscissa) time scale exemplary of the possible time behavior of signals that may occur in embodiments of the present description.
Figure 6B:
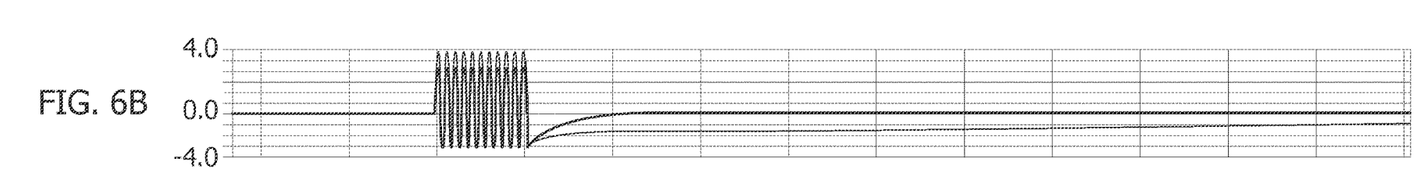
Figure 6C:
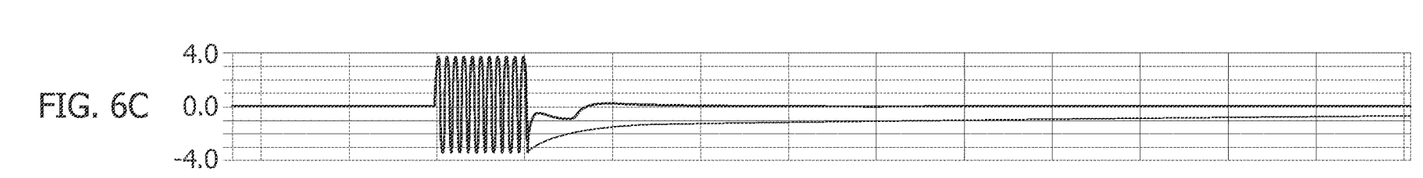
Figure 6D:
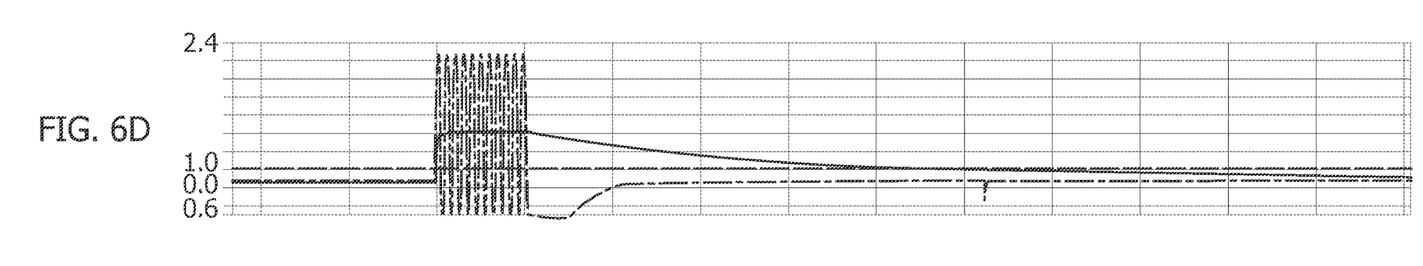

Specifically, the following signals are presented in FIGS. 6A to 6E: a signal Vsig exemplary of a shock applied to the capacitive sensor CS, e.g., at time 2.00 sec—FIG. 6A; as exemplified herein, Vsig is a pressure wave applied to the sensor and the variation in the capacitance of the sensor generates the voltage V(IN) at the node IN; the voltage V(IN) at the node IN with the antishock feature disabled (thin line) and the antishock feature enabled (thick line)—FIG. 6B; the voltage V(OUT) at the node Vout with the antishock feature disabled (thin line) and the antishock feature enabled (thick line)—FIG. 6C; the input voltage to the peak detector PD (input 18A of Op Amp 18)—chain line; "envelope" voltage (node 20)—continuous line; reference voltage Vref—dashed line—FIG. 6D; and the SHOCK signal, being asserted (e.g., going to "high" or "1") in response to a shock (e.g., acoustic pressure) and de-asserted (e.g., going to "low" or "0") only after the shock has ended—FIG. 4E.

The thick line in FIG. 6B shows that, with the antishock feature enabled, the voltage at the node IN recovers its steady state value (the value before the shock, by way of example, 888 mV) very rapidly.

The same also applies to the output voltage at Vout (thick line in FIG. 6C) that, during the shock, may saturate mirroring the input signal and, when the shock ends (with the antishock feature enabled) rapidly returns to an adequate voltage range.

Figure 6E:
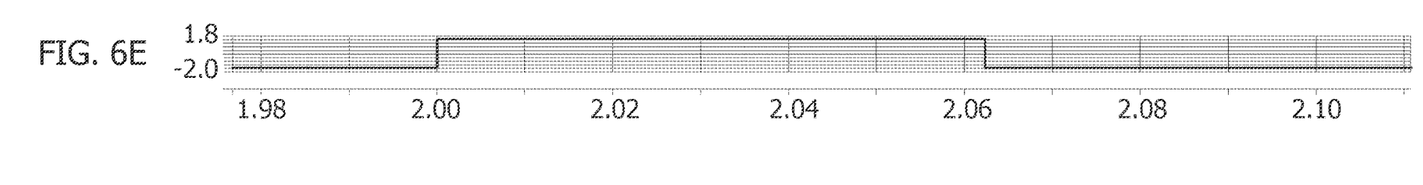

The continuous line in FIG. 6E shows the shock signal SHOCK that goes to "high" ("1") in response to the "envelope" voltage at node 20 (continuous line in FIG. 6D) reaches the reference voltage Vref (dashed line in FIG. 6D—e.g., 1 Volt) and returns to "low" (e.g., "0") (only) after a time (e.g., 50 ms) the shock has ended. The quantitative values indicate above are merely exemplary and non-limiting.

Without prejudice to the underlying principles, the details and embodiments may vary, even significantly, with respect to what has been described by way of example only without departing from the extent of protection. The extent of protection is determined by the annexed claims.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A circuit, comprising:
a sensor node configured to:
apply a bias voltage to a capacitive sensor couplable to the sensor node, and
sense a capacitance value of the capacitive sensor;
a bias node couplable to a bias voltage source;
a high-impedance network circuit coupled between the sensor node and an intermediate node, the high-impedance network circuit having a first impedance value;
a bias resistor coupled between the bias node and the intermediate node, the bias resistor having a second impedance value lower than the first impedance value;
a switch coupled between the sensor node and the intermediate node, wherein in a conductive state of the switch, the sensor node is coupled to the bias node through a series connection via the high-impedance network circuit and the bias resistor, and in a non-conductive state of the switch, the sensor node is coupled to the bias node through the bias resistor with the high-impedance network circuit bypassed; and a shock detector circuit that is sensitive to a voltage at the sensor node and coupled to the sensor node and the switch, the shock detector circuit configured to:
assert a shock signal to have the switch operate in the conductive state in response to a variation of the voltage at the sensor node from a shock applied to the capacitive sensor, and
de-assert the shock signal to have the switch operate in the non-conductive state with a delay after an end of the shock applied to the capacitive sensor.

2. The circuit of claim 1, wherein the shock detector circuit comprises:
an envelope detector circuit coupled to the sensor node via a rectifier stage, the envelope detector circuit configured to generate an envelope signal based on the voltage at the sensor node; and
a comparator circuit comprising:
a reference input configured to be set to a peak reference value, and
a comparison input coupled to the envelope detector circuit and configured to receive the envelope signal from the envelope detector circuit,
wherein the comparator circuit is configured to:
assert the shock signal in response to the envelope signal reaching the peak reference value, and
de-assert the shock signal in response to the envelope signal decaying below the peak reference value after the end of the shock applied to the capacitive sensor.

3. The circuit of claim 2, wherein the rectifier stage comprises a diode coupled to the sensor node through a gain circuit.

4. The circuit of claim 3, wherein the gain circuit comprises a differential amplifier having a first input coupled to the sensor node and a second input coupled to an output of the differential amplifier via the diode.

5. The circuit of claim 1, wherein the first impedance value and the second impedance value are in the Tera Ohm and the Giga Ohm ranges, respectively.

6. The circuit of claim 1, wherein the circuit further comprises a gain stage having an input node coupled to the sensor node and an output node configured to provide an output signal indicative of the capacitance value of the capacitive sensor.

7. The circuit of claim 6, wherein the gain stage comprises:
a differential stage having a first input coupled to the sensor node; and
feedback circuitry coupled between an output node of the differential stage and a second input of the differential stage, the feedback circuitry comprising:
a first feedback capacitor referenced to a reference node and coupled to a feedback intermediate node,
a second feedback capacitor coupled between the feedback intermediate node and the output node of the differential stage,
a feedback high-impedance network circuit coupled between the feedback intermediate node and the output node of the differential stage, the feedback high-impedance network circuit having a third impedance value, and
a feedback resistor and a second switch arranged in series and coupled between the feedback intermediate node and the output node of the differential stage, the feedback resistor having a fourth impedance value lower than the third impedance value, the second switch is coupled to the shock detector circuit,
wherein the feedback intermediate node is coupled to the output node of the differential stage via a parallel connection of the second feedback capacitor,
wherein, in a non-conductive state of the second switch, the feedback high-impedance network circuit and the feedback resistor are disconnected from the circuit, the second switch being in the non-conductive state in response to the shock signal being de-asserted, and
wherein, in a conductive state of the second switch, the feedback high-impedance network circuit and the feedback resistor are arranged in a parallel configuration, the second switch being in the conductive state in response to the shock signal being asserted.

8. The circuit of claim 7, wherein the third impedance value and the fourth impedance value are in the Tera Ohm and Giga Ohm ranges, respectively.

9. A sensor device, comprising:
a capacitive sensor having a capacitive value that is a function of a sensed signal;
a circuit, comprising:
a sensor node configured to:
apply a bias voltage to the capacitive sensor coupled to the sensor node, and
sense the capacitance value of the capacitive sensor;
a bias node couplable to a bias voltage source;
a high-impedance network circuit coupled between the sensor node and an intermediate node, the high-impedance network circuit having a first impedance value;
a bias resistor coupled between the bias node and the intermediate node, the bias resistor having a second impedance value lower than the first impedance value;
a switch coupled between the sensor node and the intermediate node, wherein in a conductive state of the switch, the sensor node is coupled to the bias node through a series connection via the high-impedance network circuit and the bias resistor, and in a non-conductive state of the switch, the sensor node is coupled to the bias node through the bias resistor with the high-impedance network circuit bypassed; and
a shock detector circuit that is sensitive to a voltage at the sensor node and coupled to the sensor node and the switch, the shock detector circuit configured to:
assert a shock signal to have the switch operate in the conductive state in response to a variation of the voltage at the sensor node from a shock applied to the capacitive sensor, and
de-assert the shock signal to have the switch operate in the non-conductive state with a delay after an end of the shock applied to the capacitive sensor.

10. The sensor device of claim 9, wherein the capacitive sensor is a microphone.

11. The sensor device of claim 9, wherein the capacitive sensor is a micro-electro-mechanical system (MEMS) type of a microphone.

12. The sensor device of claim 9, wherein the shock detector circuit comprises:
an envelope detector circuit coupled to the sensor node via a rectifier stage, the envelope detector circuit configured to generate an envelope signal based on the voltage at the sensor node; and
a comparator circuit comprising:
a reference input configured to be set to a peak reference value, and
a comparison input coupled to the envelope detector circuit and configured to receive the envelope signal from the envelope detector circuit,
wherein the comparator circuit is configured to:

assert the shock signal in response to the envelope signal reaching the peak reference value, and de-assert the shock signal in response to the envelope signal decaying below the peak reference value after the end of the shock applied to the capacitive sensor.

13. The sensor device of claim 12, wherein the rectifier stage comprises a diode coupled to the sensor node through a gain circuit, and wherein the gain circuit comprises a differential amplifier having a first input coupled to the sensor node and a second input coupled to an output of the differential amplifier via the diode.

14. The sensor device of claim 9, wherein the circuit further comprises a gain stage having an input node coupled to the sensor node and an output node configured to provide an output signal indicative of the capacitance value of the capacitive sensor.

15. The sensor device of claim 14, wherein the gain stage comprises:
 a differential stage having a first input coupled to the sensor node; and
 feedback circuitry coupled between an output node of the differential stage and a second input of the differential stage, the feedback circuitry comprising:
 a first feedback capacitor referenced to a reference node and coupled to a feedback intermediate node,
 a second feedback capacitor coupled between the feedback intermediate node and the output node of the differential stage,
 a feedback high-impedance network circuit coupled between the feedback intermediate node and the output node of the differential stage, the feedback high-impedance network circuit having a third impedance value, and
 a feedback resistor and a second switch arranged in series and coupled between the feedback intermediate node and the output node of the differential stage, the feedback resistor having a fourth impedance value lower than the third impedance value, the second switch is coupled to the shock detector circuit,
 wherein the feedback intermediate node is coupled to the output node of the differential stage via a parallel connection of the second feedback capacitor,
 wherein, in a non-conductive state of the second switch, the feedback high-impedance network circuit and the feedback resistor is disconnected from the circuit, the second switch being in the non-conductive state in response to the shock signal being de-asserted, and
 wherein, in a conductive state of the second switch, the feedback high-impedance network circuit and the feedback resistor are arranged in a parallel configuration, the second switch being in the conductive state in response to the shock signal being asserted.

16. The sensor device of claim 15, wherein the first impedance value and the third impedance value are in the Tera Ohm range, and wherein the second impedance value and the fourth impedance value are in the Giga Ohm range.

17. A method, comprising:
 coupling a sensor node of a circuit to a capacitive sensor;
 applying a bias voltage to the capacitive sensor;
 sensing a capacitance value of the capacitive sensor;
 coupling a bias node to a bias voltage source;
 coupling a high-impedance network circuit between the sensor node and an intermediate node, the high-impedance network circuit having a first impedance value, the high-impedance network circuit having an associated bypass switch coupled between the sensor node and the intermediate node, wherein in a conductive state of the associated bypass switch, the sensor node coupled to the bias node through a series connection via the high-impedance network circuit and a bias resistor, and in a non-conductive state of the associated bypass switch, the sensor node is coupled to the bias node through the bias resistor with the high-impedance network circuit bypassed;
 coupling the bias resistor between the bias node and the intermediate node, the bias resistor having a second impedance value lower than the first impedance value;
 asserting, by a shock detector circuit, a shock signal to have the associated bypass switch operate in the conductive state in response to a voltage variation at the sensor node from a shock applied to the capacitive sensor, the shock detector circuit being sensitive to a voltage at the sensor node and coupled to the sensor node and the associated bypass switch; and
 de-asserting, by the shock detector circuit, the shock signal to have the associated bypass switch operate in the non-conductive state with a delay after an end of the shock applied to the capacitive sensor.

18. The method of claim 17, the method further comprising:
 generating, by an envelope detector circuit of the shock detector circuit, an envelope signal based on the voltage at the sensor node, the envelope detector circuit coupled to the sensor node via a rectifier stage;
 receiving, by a comparison input of a comparator circuit of the shock detector circuit, the envelope signal from the envelope detector circuit, the comparator circuit having a reference input set to a peak reference value, the comparison input coupled to the envelope detector circuit;
 asserting, by the comparator circuit, the shock signal in response to the envelope signal reaching the peak reference value; and
 de-asserting, by the comparator circuit, the shock signal in response to the envelope signal decaying below the peak reference value after the end of the shock applied to the capacitive sensor.

19. The method of claim 18, wherein the rectifier stage comprises a diode coupled to the sensor node through a gain circuit, wherein the gain circuit comprises a differential amplifier having a first input coupled to the sensor node and a second input coupled to an output of the differential amplifier via the diode.

20. The method of claim 17, wherein the circuit further comprises a gain stage having an input node coupled to the sensor node and an output node, the gain stage comprising a differential stage having a first input coupled to the sensor node, the gain stage comprising a feedback circuitry coupled between an output node of the differential stage and a second input of the differential stage, the feedback circuitry comprising a first feedback capacitor referenced to a reference node and coupled to a feedback intermediate node, the feedback circuity comprising a second feedback capacitor coupled between the feedback intermediate node and the output node of the differential stage, the feedback circuitry comprising a feedback high-impedance network circuit coupled between the feedback intermediate node and the output node of the differential stage, the feedback high-impedance network circuit having a third impedance value, the feedback circuitry comprising a feedback resistor and a second switch arranged in series and coupled between the feedback intermediate node and the output node of the differential stage, the feedback resistor having a fourth impedance value lower than the third impedance value, the second switch is coupled to the shock detector circuit, and the feedback intermediate node coupled to the output node of the differential stage via a parallel connection of the second feedback capacitor, wherein the method further comprises:

providing, by the output node, an output signal indicative of the capacitance value of the capacitive sensor, disconnecting the feedback high-impedance network circuit and the feedback resistor from the circuit in a non-conductive state of the second switch, the second switch being in the non-conductive state in response to the shock signal being de-asserted, and arranging the feedback high-impedance network circuit and the feedback resistor in a parallel configuration in a conductive state of the second switch, the second switch being in the conductive state in response to the shock signal being asserted.

* * * * *